United States Patent [19]

McClaughry

[11] 3,946,245

[45] Mar. 23, 1976

[54] FAST-ACTING FEEDFORWARD KICKER CIRCUIT FOR USE WITH TWO SERIALLY CONNECTED INVERTERS

[75] Inventor: Michael J. McClaughry, Rosemont, Ill.

[73] Assignee: Teletype Corporation, Skokie, Ill.

[22] Filed: Feb. 12, 1975

[21] Appl. No.: 549,603

[52] U.S. Cl. .............. 307/205; 307/251; 307/270; 307/DIG. 4
[51] Int. Cl.² H03K 19/08; H03K 17/04; H03K 17/10; H03K 17/60
[58] Field of Search .......... 307/205, 214, 251, 270, 307/304, DIG. 4

[56] References Cited
UNITED STATES PATENTS

| | | | |
|---|---|---|---|
| 3,395,291 | 7/1968 | Bogert | 307/205 |
| 3,480,796 | 11/1969 | Polkinghorn et al. | 307/279 X |
| 3,631,267 | 12/1971 | Heimbigner | 307/304 X |
| 3,675,043 | 7/1972 | Bell | 307/205 |
| 3,714,466 | 1/1973 | Spence | 307/251 X |
| 3,749,936 | 7/1973 | Bell | 307/205 X |
| 3,765,003 | 10/1973 | Paivinen et al. | 307/279 X |
| 3,845,324 | 10/1974 | Feucht | 307/205 |
| R27,305 | 3/1972 | Polkinghorn et al. | 307/251 |

Primary Examiner—Jonn S. Heyman
Assistant Examiner—L. N. Anagnos
Attorney, Agent, or Firm—D. L. Hurewitz; J. L. Landis

[57] ABSTRACT

A field-effect transistor serial inverter circuit is disclosed. Capacitive coupling is provided between the control electrode of a first inverter and the control electrode of a load transistor in a serially connected second inverter. The capacitor thereby couples the input to the load transistor of the second inverter, significantly reducing the transition delay time associated with the two series inverters, and also increasing the voltage level available at the output of the second inverter to substantially the same level as the supply voltage.

20 Claims, 2 Drawing Figures

FAST-ACTING FEEDFORWARD KICKER CIRCUIT FOR USE WITH TWO SERIALLY CONNECTED INVERTERS

BACKGROUND OF THE INVENTION

This invention relates to field-effect transistor logic circuitry and more particularly, to such circuits containing a pair of serial inverters.

The basic field-effect transistor, or FET, inverter consists essentially of a load FET and an input FET. The load FET serves essentially as a resistor connected between a supply voltage and a common node. The input FET whose drain-source path is connected between the common node and a circuit reference point acts as a switch. As is well-known, one particular type of field-effect transistor is the metal-oxide-semiconductor FET known generally as a MOSFET and all FETS referred to hereinafter are assumed P-channel MOSFET devices of the enhancement mode type, but it is understood that N-channel depletion mode MOSFET devices, or other types of transistors are equally applicable.

In the basic FET inverter the input is applied to the gate of the input FET, and a ground input, defined, for instance, as a logical 0, causes the input FET to be non-conductive; thus, the fixed voltage provided at the common node by the load FET represents the inversion of the input. A negative input sufficient to cause the input FET to become conductive is defined as the opposite logic state or logical 1. This input grounds the common node providing a logical 0. The output level is determined by the supply voltage so that the inverter can also provide amplification.

In some logic applications, two serially connected inverters are required, such as where the circuit functions as a preamplifier for a push-pull amplifier. All FET inverters exhibit an inherent delay and where a serial pair of inverters is utilized, both contribute to the total delay. Since the speed of the logic circuit is often of paramount importance, this combined delay is unacceptable in many circumstances. Therefore improvements in the speed of inverter operation have been suggested. For instance, an inverter may be provided with a bootstrap capacitor coupling the gate of its load FET to the common node. The resultant capacitive feedback causes the voltage of the gate of the load FET to approximately follow the voltage at the common node, thereby maintaining a nearly constant current through the load FET during the voltage transition at the common node. This speeds up the transition because there is no opposing current change as there would be without the bootstrapping. A single bootstrap inverter is disclosed, for instance, in FIG. 1 of R. W. Polkinghorn et al. Re 27,305, issued Mar. 14, 1972, and it may, of course, be serially coupled to another inverter as shown in FIG. 1 hereof.

However, transition speed of a pair of serial inverters in which the inverters are individually bootstrapped may still not be sufficient since the second of the inverters must await the change of state of the preceding inverter and this serial delay is not compensated for by the bootstrapping of either inverter. Furthermore, bootstrapping each inverter complicates the circuit since an isolating FET as well as the capacitor is required to bootstrap each inverter.

It is therefore an object of the present invention to provide a fast-acting logic circuit.

It is a further object to provide a fast-acting, serial inverter circuit which compensates for serial delay.

It is also an object to provide a fast-acting, amplifier which provides two serial inversions.

It is still a further object to provide a fast-acting serial inverter circuit utilizing field-effect transistors of the metal-oxide-semiconductor type.

SUMMARY OF THE INVENTION

In accordance with the present invention, capacitive coupling is provided between the input to the first of a pair of serially connected inverters and the load transistor of the second of the pair of inverters. This coupling provides feedforward of the input voltage to the control electrode of the load transistor of the second inverter. Since the common node of the second inverter is the circuit output and the voltage signal at this output is the twice-inverted form of the voltage signal at the circuit input, the feedforward voltage, which is uneffected by the delay of either inverter, anticipates the output voltage signal. This close correlation between the voltage at the control electrode of the load transistor of the second inverter and the forthcoming voltage at the common node overcomes the serial delay found in the prior art and, in fact, aids the transition at the common node. Thus, this feedforward kicker circuit provides faster operation of the two serial inverters than was previously possible. The feedforward voltage also boosts the output voltage substantially to the level of the supply voltage, as would the feedback voltage provided by bootstrapping the second inverter.

DETAILED DESCRIPTION

Figure 1:
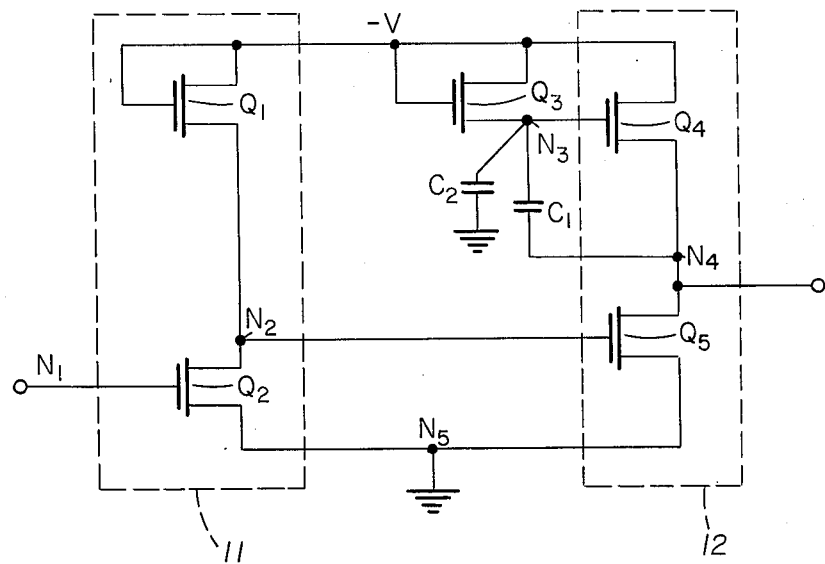
FIG. 1 is a schematic diagram of a serial inverter utilizing the bootstrapping technique of the prior art to increase speed.

The circuit of FIG. 1 illustrates a serially connected pair of inverters 11 and 12 in which inverter 12 is bootstrapped in accordance with prior art technique. Inverter 11 consists of load FET $Q_1$ and input FET $Q_2$. The drain-source path of $Q_1$ is connected between a source of supply voltage $-V$ and the common node $N_2$ of inverter 11. The gate of $Q_1$ is connected to a negative bias voltage which may be $-V$ as shown. Input FET $Q_2$ acts as a switch. Its drain-source path connects the common node $N_2$ and a voltage reference node $N_5$, shown as ground. When the input signal voltage applied at node $N_1$ is zero (assumed to represent a logical 0), $Q_2$ is non-conductive or OFF and node $N_2$ is therefore near the supply voltage $-V$ representing a logical 1. When the input at node $N_1$ is sufficiently negative (representing a logical 1), $Q_2$ is ON causing node $N_2$ to go essentially to the potential of node $N_5$, or ground, representative of a logical 0. Thus inverter 11 produces at node $N_2$ a signal which is logically opposite or inverted from the input signal at node $N_1$.

In inverter 12, $Q_4$ and $Q_5$ perform similarly to $Q_1$ and $Q_2$, respectively. The once-inverted signal at node $N_2$ is therefore reinverted to produce a twice-inverted signal at the output node $N_4$. The load connected to node $N_4$ is not shown but is assumed to be capacitive although a resistive or inductive load would serve just as well.

The bootstrap capacitor $C_1$ is used to increase the speed of inverter 12. If the bootstrap arrangement consisting of capacitor $C_1$ and isolating FET $Q_3$, were not included in the circuit, the gate of load FET $Q_4$ would be connected directly to the fixed supply voltage $-V$, and the drain-source current, which is proportional to the square of the gate-source voltage, would therefrom be a function of the voltage at node $N_2$ (source voltage). Accordingly, when input FET $Q_5$ is OFF and the voltage at node $N_4$ is near $-V$, no significant current is drawn through FET $Q_4$. When $Q_5$ is turning ON, it draws current from node $N_4$ in order to discharge node $N_4$ to ground (potential of node $N_5$). However, with the gate-source voltage of $Q_4$ increasing, the current through FET $Q_4$ increases and this increasing current must also pass to ground through $Q_5$. Accordingly, the increase in $Q_4$ current opposes the transition at node $N_4$ and serves to slow the operation of the circuit. Conversely, if FET $Q_5$ is turning OFF, the voltage at node $N_4$ is changing from ground toward $-V$, and since the voltage at node $N_4$ is becoming increasingly more negative, the current through FET $Q_4$ is decreasing, consequently making less current available at node $N_4$ for charging the load and hence effecting the transition.

These inherent limitations upon the speed of transitions at node $N_4$ are reduced by the bootstrapping shown in FIG. 1. The gate of FET $Q_4$ is separated from supply voltage $-V$ by isolating FET $Q_3$. For a voltage change at node $N_4$ of $\Delta V_{N4}$ the change at node $N_3$ will be $\Delta V_{N4}$.

$$\left(\frac{C_1}{C_1 + C_2}\right)$$

due to the feedback via the voltage divider formed by capacitors $C_1$ and $C_2$, where $C_2$ is a stray capacitance caused primarily by the geometry of the semiconductor structure. By design $C_1$ is made substantially larger than $C_2$ so that most of the voltage change at node $N_4$ is coupled to node $N_3$. In this way, the gate-source voltage of FET $Q_4$ is kept nearly constant and the current through FET $Q_4$ is maintained relatively constant though the voltage at node $N_4$ is changing.

For example, when $Q_5$ turns ON and node $N_4$ starts to go to ground, this change in voltage is partially coupled to node $N_3$ (the gate of FET $Q_4$) by bootstrap capacitor $C_1$. Thus, the gate-source voltage of FET $Q_4$ changes only slightly from its pre-transition value, and the current through $Q_4$ will likewise remain near its low pre-transition value. Therefore, FET $Q_5$ can discharge current from the load, not shown, without substantial opposition from the current through FET $Q_4$. Hence, the bootstrapping speeds up the transition. Similarly, the fact that the voltage at node $N_3$ closely follows the voltage at node $N_4$ creates a faster logic transition when FET $Q_5$ is turning OFF.

This bootstrap coupling is normally made sufficient to cause node $N_3$ to be more than a threshold more negative than the supply voltage $-V$. Therefore, the source of FET $Q_4$ (node $N_4$) will reach the voltage at its drain $(-V)$. Thus, the bootstrap coupling has the auxiliary effect of boosting the output voltage at node $N_4$ to substantially the level of the supply voltage for the logic state corresponding to logical 1.

While the positive feedback provided by bootstrapping does increase the speed of a single inverter, it does so by responding only after the transition at the common node has begun. This technique is incapable of reducing the serial delay, inherent in the operation of two successive inverters and caused by the fact that one inverter drives another only after the first has made a transition.

Bootstrapping two serially connected inverters would, of course, increase overall speed, but a duplicate bootstrap circuit, including an isolating FET and a capacitor would be required for each inverter.

Figure 2:
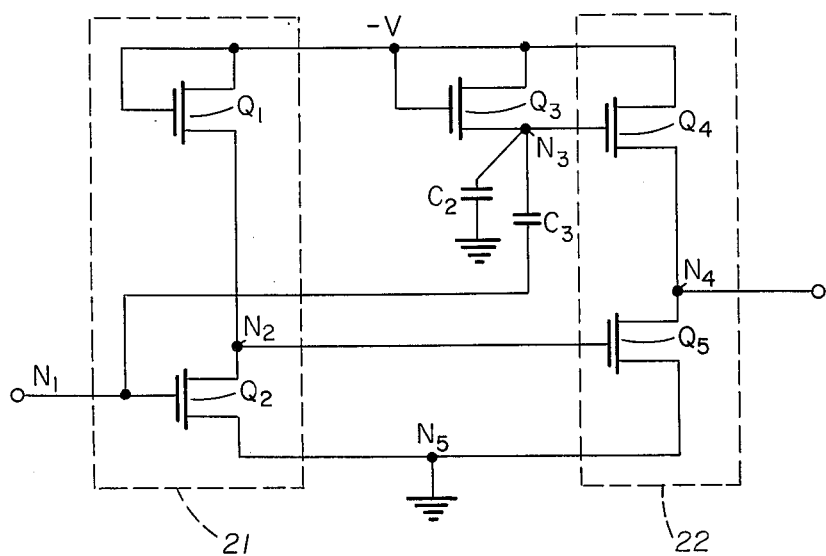
FIG. 2 is a schematic diagram of a serial pair of inverters in accordance with the present invention.

FIG. 2 illustrates serially connected inverters 21 and 22 corresponding essentially to the inverters 11 and 12 of FIG. 1 respectively, and all elements common to both figures are given the same numerical designation. Inverter 21 consisting of load FET $Q_1$ and input FET $Q_2$ is connected and operates identically to the previously described inverter 11. $Q_1$ functions as a resistor and $Q_2$ functions as a switch sensitive to the voltage applied to input node $N_1$.

Inverter 22 consists of load FET $Q_4$ and input FET $Q_5$. The drain-source path of load FET $Q_4$ connects the supply voltage $-V$ to node $N_4$, and the drain-source path of input FET $Q_5$ connects node $N_4$ to the current reference node $N_5$. The gate of FET $Q_5$ is connected to node $N_2$, the output of inverter 21, and the gate of load FET $Q_4$ is connected to the supply voltage $-V$ through the drain-source path of isolating device FET $Q_3$ whose gate is also connected to $-V$. Stray capacitance $C_2$ associated with the gate of $Q_4$ is also shown.

Inverter 22 operates similarly to the previously described inverter 12. Thus the once-inverted signal at $N_2$ is applied to input FET $Q_5$ causing $Q_5$ to switch and produce a twice-inverted signal at the output node $N_4$. However, there is no bootstrapping between node $N_4$ and node $N_3$. Instead, in accordance with the invention, input node $N_1$ is capacitively coupled by capacitor $C_3$ to node $N_3$ (the gate of load FET $Q_4$). The input voltage at node $N_1$ is obviously unaffected by the delays associated with the inverters 21 and 22 and it is logically similar to the twice-inverted signal at output node $N_4$.

This input signal which is fed forward from node $N_1$ to node $N_3$ actually anticipates the voltage change at $N_4$. Thus, node $N_3$ leads node $N_4$ slightly and insures that the gate-source voltage of FET $Q_4$ changes in advance of and in aid of the transition at node $N_4$. For example, if $Q_5$ is turning ON, node $N_3$ will receive "advance notice" since the twice-inverted signal being produced at node $N_4$ is logically the same as the signal at input node $N_1$. This causes a decreasing current through FET $Q_4$ as FET $Q_5$ turns ON (node $N_4$ discharging to ground). Similarly, when $Q_5$ is about to turn OFF, the advance application of a logical 1 signal to node $N_3$ will cause the current through $Q_4$ to increase slightly in advance of and while $Q_5$ is turning OFF (node $N_4$ charging to $-V$).

The feedforward capacitor $C_3$ forms a voltage divider with the stray capacitance $C_2$. Thus, a change in the voltage at node $N_1$, $\Delta V_{N1}$, will produce $\Delta V_{N1}$.

$$\left(\frac{C_3}{C_3 + C_2}\right)$$

at node $N_3$. Therefore, $C_3$ should be substantially larger than $C_2$ for adequate coupling. It is noted that one skilled in the art could, of course, make appropriate adjustment of values in order to control the speed of the circuit. However, it is obvious that if the feedforward coupling is large while the operations of the input transistors $Q_2$ and $Q_5$ are very slow, the increase in current through $Q_4$ in anticipation of $Q_5$ turning OFF, could occur long before $Q_5$ begins to switch and this would result in a large transient current through $Q_5$.

As in the bootstrap arrangement, the application of additional voltage to the gate of load FET $Q_4$ increases the voltage level available for the logical 1 state at the output of the second inverter 22 to substantially the same level as the supply voltage $-V$, and this may be of significantly greater magnitude than the corresponding voltage at the input node $N_1$. But the major feature of the circuit is that the feedforward voltage, which is unaffected by the successive switch delays inherent in the combined operation of serial inverters 21 and 22, causes the overall circuit to function faster than the circuit of FIG. 1. The feedforward coupling via capacitor $C_3$ thus serves as a fast-acting kicker circuit for the serially connected inverted pair.

The FETS included in the above description may be any appropriate devices. The discussion has, however, assumed that they are field-effect transistors of the metaloxide semiconductor type and that P-channel enhancement mode elements are used. Alternative types of devices may, of course, be substituted, and when necessary, appropriate modifications of parameters such as biases would have to be made. In particular, load FET $Q_1$ could be bootstrapped, or it could be replaced by another type of transistor or by a two terminal diode. Also, input FETS $Q_2$ and $Q_5$, which provide the input switching function, could be replaced by more complicated logic circuitry or by switch devices other than FETS such as, for example, bipolar transistors.

In addition, two supply voltages could be substituted for the single supply $-V$ shown, as disclosed in U.S. Pat. No. 3,845,324, issued to C. A. Feucht, Oct. 29, 1974. The drain of a given load FET would then be connected to one source and the gate, or the isolating transistor coupled to the gate, would be connected to the other more negative source.

In all cases it is to be understood that the above described arrangements are merely illustrative of a small number of the many possible applications of the principles of the present invention. Numerous and varied other arrangements in accordance with these principles may readily be devised by those skilled in the art without departing from the spirit and scope of the invention.

What is claimed is:

1. A serial inverter circuit comprising:
   a first and second inverter means, each having an input and an output, for producing at their outputs a logically inverted version of the signal applied to their respective inputs;
   means for connecting the output of the first inverter means to the input of the second inverter means, whereby after a finite transition delay determined by the circuit values, the signal produced at the output of the second inverter means is logically identical to the signal applied to the input of the first inverter means; and
   feedforward means for coupling the signal applied to the input of the first inverter means to the second inverter means to speed up all transitions of the signal at the output of the second inverter means made in response to a change of logical state of the signal applied to the input of the first inverter means.

2. A serial inverter circuit as claimed in claim 1 wherein the second inverter means includes:
   a primary voltage source;
   a circuit reference node;
   an input device connected to the input of the second inverter means for selectively creating a conductive path between the circuit reference node and the output of the second inverter means in accordance with the signal applied thereto from the output of the first inverter means; and
   a load device having a first controlled electrode coupled to said primary voltage source, a second controlled electrode coupled to the output of the second inverter means, and a control electrode connected to said feedforward means.

3. A serial inverter circuit as claimed in claim 2 wherein the load device is a field-effect transistor having its drain-source path connected between the primary voltage source and the output of the second inverter means, and having means connected to its gate for isolating the gate from the primary voltage source; and
   the feedforward means causing the voltage on the gate of the load device to always track the voltage at the input of the first inverter means, and thereby anticipate the voltage at the output of the second inverter means.

4. The serial inverter circuit as claimed in claim 2 wherein the feedforward means includes a capacitive coupling between the input of the first inverter means and the control electrode of the load device of the second inverter means.

5. A serial inverter circuit as claimed in claim 3 wherein the isolating means is a field-effect transistor having a first controlled electrode connected to the gate of the load device and having a second controlled electrode connected to a second voltage source, said isolating transistor being maintained in a conductive state.

6. A serial inverter circuit as claimed in claim 5 wherein the isolating field-effect transistor has a control electrode connected to said second voltage source, said second voltage source being the same as the primary voltage source.

7. A serial inverter circuit as claimed in claim 3 wherein the input device of the second inverter means is a field-effect transistor having its drain-source path connected between the circuit reference node and the output of the second inverter means and its gate electrode connected to the output of the first inverter means.

8. A serial inverter circuit as claimed in claim 7 wherein the input field-effect transistor and the load field-effect transistor are of the metal-oxide-semiconductor type.

9. A serial inverter circuit as claimed in claim 2 wherein the first inverter means includes an input field-effect transistor having its drain-source path connected between the circuit reference node and the output of the first inverter means, and having its gate connected to the input of the first inverter means; and
   a load device connected between the primary voltage source and the output of the first inverter means.

10. A serial inverter circuit as claimed in claim 2 wherein the voltage level of the primary voltage source is selected so that the voltage level at the output of the second inverter means is greater in magnitude than the voltage level of the logically identical signal at the input of the first inverter means for at least one logic state.

11. A serial inverter circuit of the type having:

a first and second inverter means, each having an input and an output, for producing at their outputs logically inverted versions of the signal applied to their respective inputs;

means for connecting the output of the first inverter means to the input of the second inverter means, whereby after a finite transition time determined by the circuit values, the signal produced at the output of the second inverter means is logically identical to the signal applied to the input of the first inverter means; characterized in that, the circuit further includes feedforward means for coupling the signal applied to the input of the first inverter means to the second inverter means such that the signal at the output of the second inverter means responds to all changes in logical state of the signal applied to the input of the first inverter means in a time less than said finite transition delay.

12. A serial inverter circuit as claimed in claim 11 wherein the second inverter means includes:

a primary voltage source;

a circuit reference node;

an input device connected to the input of the second inverter means for selectively creating a conductive path between the circuit reference node and the output of the second inverter means in accordance with the signal applied thereto from the output of the first inverter means; and a load device having a first controlled electrode coupled to said primary voltage source, a second controlled electrode coupled to the output of the second inverter means, and a control electrode, said feedforward means being connected to the control electrode so that the voltage at the control electrode always tracks the voltage at the input of the first inverter means.

13. A serial inverter circuit as claimed in claim 12 wherein the load device is a field-effect transistor having its drain-source path connected between the primary voltage source and the output of the second inverter means, and having means connected to its gate for isolating the gate from the primary voltage source; and the feedforward means causing the voltage on the gate of the load device to anticipate the voltage at the output of the second inverter means.

14. A serial inverter circuit as claimed in claim 13 wherein the feedforward means includes a capacitive coupling between the input of the first inverter means and the gate of the load device of the second inverter means.

15. A serial inverter circuit as claimed in claim 13 wherein the isolating means is a field-effect transistor having a first controlled electrode connected to the gate of the load device and having a second controlled electrode connected to a second voltage source, said isolating transistor being maintained in a conductive state.

16. A serial inverter circuit as claimed in claim 15 wherein the isolating field-effect transistor has a control electrode connected to said second voltage source.

17. A serial inverter circuit as claimed in claim 16 wherin said second voltage source is the same as the primary voltage source.

18. A serial inverter circuit as claimed in claim 13 wherein the input device of the second inverter means is a field-effect transistor having its drain-source path connected between the circuit reference node and the output of the second inverter means and its gate electrode connected to the output of the first inverter means.

19. A serial inverter circuit as claimed in claim 18 wherein the input field-effect transistor and the load field-effect transistor are of the metal-oxide-semiconductor type.

20. A serial inverter circuit having:

an input;

an output;

a voltage source node;

a circuit reference node;

a first inverter formed by a first load field-effect transistor and a first input field-effect transistor, the first load transistor having its gate connected to the voltage source node and its drain-source path connected between the voltage source node and a common node, and the first input transistor having its drain-source path connected between the common node and the circuit reference node and its gate connected to the input;

a second inverter formed by a second load field-effect transistor and a second input field-effect transistor, the second load transistor having its drain-source path connected between the voltage source node and the output, the second input transistor having its drain-source path connected between the output and the circuit reference node and its gate connected to the common node;

an isolating field-effect transistor having its drain-source path connected between the voltage source node and the gate of the second load transistor, and having its gate connected to the voltage source node; and a capacitor connected between the input and the gate of the second load transistor.

* * * * *